(12) United States Patent
Croffie et al.

(10) Patent No.: US 7,001,695 B2
(45) Date of Patent: Feb. 21, 2006

(54) MULTIPLE ALTERNATING PHASE SHIFT TECHNOLOGY FOR AMPLIFYING RESOLUTION

(75) Inventors: Ebo H. Croffie, Portland, OR (US); Christopher Neville, Portland, OR (US)

(73) Assignee: LSI Logic Corporation, Milpitas, CA (US)

( * ) Notice: Subject to any disclaimer, the term of this patent is extended or adjusted under 35 U.S.C. 154(b) by 213 days.

(21) Appl. No.: 10/435,442

(22) Filed: May 9, 2003

(65) Prior Publication Data

US 2004/0224239 A1 Nov. 11, 2004

(51) Int. Cl.
*G03F 9/00* (2006.01)
(52) U.S. Cl. .......................................... 430/5
(58) Field of Classification Search .................... 430/5, 430/30
See application file for complete search history.

(56) References Cited

U.S. PATENT DOCUMENTS

| 5,620,816 A | 4/1997 | Dao |
| 5,807,649 A | 9/1998 | Liebmann et al. |
| 6,251,549 B1 | 6/2001 | Levenson |
| 6,287,732 B1 | 9/2001 | Levenson |
| 6,479,196 B1 | 11/2002 | Levenson |

*Primary Examiner*—Saleha R. Mohamedulla
(74) *Attorney, Agent, or Firm*—Trexler, Bushnell, Giangiorgi & Blackstone, LTD

(57) ABSTRACT

A method and apparatus for improving resolution in photolithography. The method includes steps of mapping a first phase onto a first mask, mapping a second phase onto a second mask, and mapping a trim onto the first mask or second mask (or both). Specifically, the first mask may include Phase1 mapped to 0/180 phase, and the second mask may include Phase2 and trim mapped to 0/180 phase. A set of masks consistent with the foregoing is provided.

10 Claims, 5 Drawing Sheets

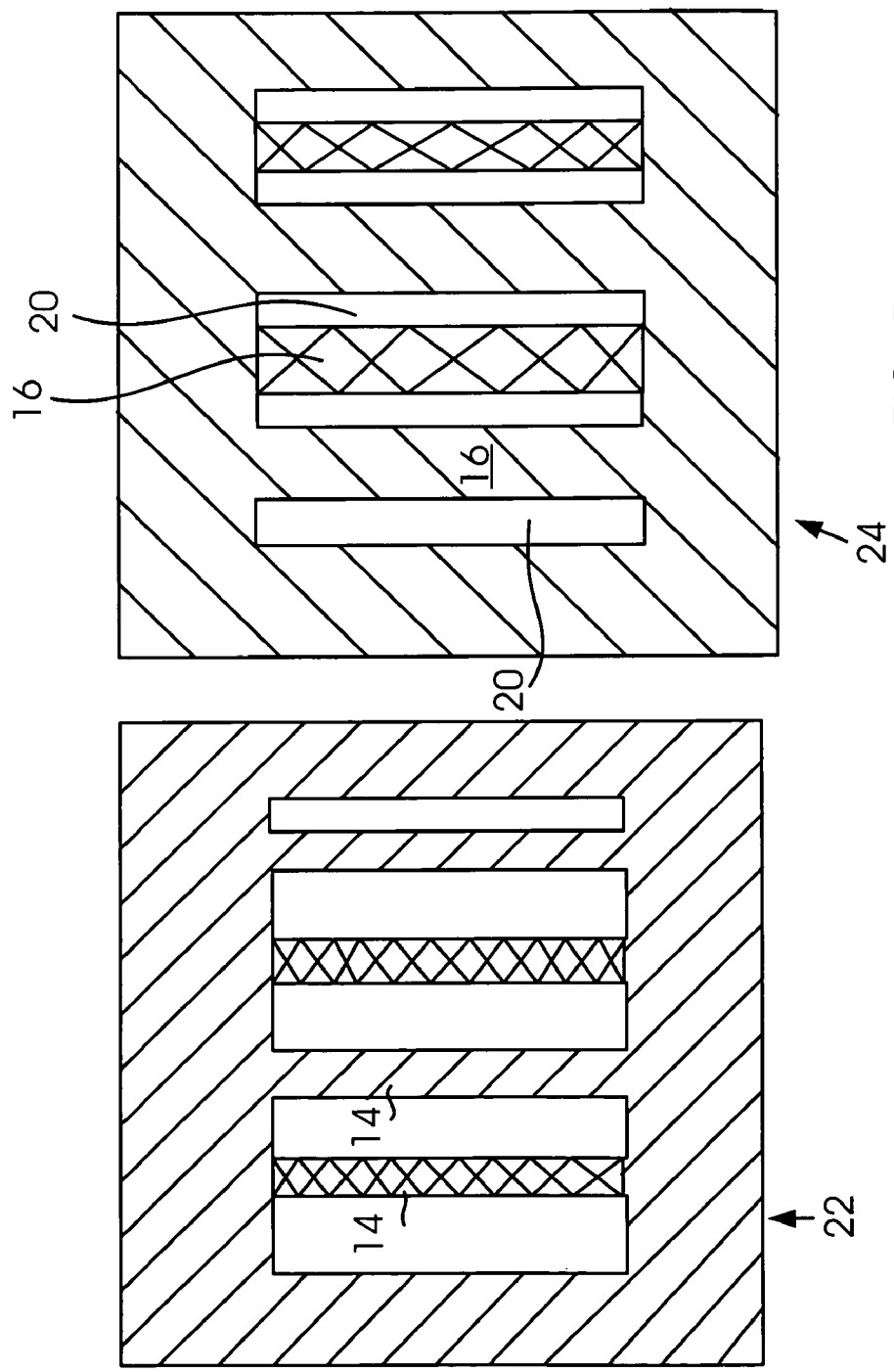

MULTIPLE ALTERNATING PHASE SHIFT TECHNOLOGY FOR AMPLIFYING RESOLUTION

BACKGROUND

The present invention generally relates to photolithography, and more specifically relates to methods and apparatuses for increasing resolution limits in photolithography.

Microlithography is used to manufacture integrated circuits, magnetic devices, and other microdevices. In microlithography, a final product is manufactured in a multiple step process, where initially a "resist" material is produced with each pattern subsequently defining a product attribute. "Resists" are generally formed of polymer compositions, and are sensitive to light or other forms of radiation. The patterns are formed in the resist by exposing different regions of the resist material to different radiation doses. In bright regions, chemical changes occur in the resist that cause it to dissolve more easily (for positive resist) or less easily (for negative resists) than in dim regions. The bright and dim regions are exposed using an exposure tool which generally transfers corresponding features from a mask or reticle. The masks or reticles are generally plates of quartz coated with an opaque material such as chrome. The chrome is etched away to form the mask. The radiation used may be, for example, ultraviolet light and x-rays, and the regions of the mask that are opaque and transparent form a pattern of bright and dark when illuminated uniformly.

Typically, a projection lens is used to form an image of the mask pattern on the resist film. The patterns formed in the resist are not identical to those on the mask, and the methods of obtaining the pattern desired for the ultimate manufactured device in spite of deficiencies in the process is called "wavefront engineering." This includes Optical and Process Correction or Optical Proximity Correction (OPC), wherein edge placements are manipulated, and off-axis illuminations. Among the various devices used are phase shift masks (PSMs), which create desired dark regions through interference. Presently, two types of phase shift masks are in use: weak-PSMs and strong-PSMs, such as Alternating-Aperture-PSMs. These two differ in that the weak-PSMs have only one type of bright feature, while the strong-PSMs contain two types of bright features identical except for the optical phase, which differs by 180 degrees. Phase shift masks and their use in photolithography are described in detail in several existing documents, including U.S. Pat. Nos. 5,620,816; 5,807,649; 6,251,549; 6,287,732 and 6,479,196, all of which are incorporated herein by reference in their entirety.

Although phase shift masks and their use in photolithography provide distinct advantages, improvements can be made with regard to resolution, and the present invention is directed at improving resolution limits when using masks in a photolithography process, such as when using, for example, Alternating-Aperture-PSMs or Alternating-PSMs.

In the use of Alternating-PSMs, to produce a target layout 10 as illustrated in FIG. 1, a phase mask 12 as illustrated in FIG. 2 is formed where the phase mask includes Phase1 14 and Phase2 16, and a binary trim/field mask 18 as illustrated in FIG. 3 is formed, where the binary trim/field mask 18 includes trim patterns 20. For double exposure Alternating-PSM technology, full resolution enhancement potential of the second mask, i.e., the binary trim/field mask (see FIG. 3) is not generally possible. Different exposure conditions for the two masks (i.e., the phase mask 12 as shown in FIG. 2 and the binary trim/field mask 18 as shown in FIG. 3) reduce throughput, and the binary trim/field mask 18 is difficult to image due to near-resolution-limit binary mask exposure.

OBJECTS AND SUMMARY

An object of an embodiment of the present invention is to provide an improvement to Alternating-PSM technology, as well as provide an invention which can be applied to other mask technologies.

Another object of an embodiment of the present invention is to provide a set of masks and a method of making a set of masks wherein minimum resolution is enhanced.

Yet another object of an embodiment of the present invention is to provide a set of masks and a method of making a set of masks wherein the patterns are easier to image.

Still another object of an embodiment of the present invention is to provide a set of masks and a method of making a set of masks wherein the same exposure conditions can be used.

Briefly, and in accordance with at least one of the foregoing objects, an embodiment of the present invention provides a method which includes steps of mapping a first phase onto a first mask, mapping a second phase onto a second mask, and mapping a trim onto the first mask or second mask (or both). Specifically, the first mask may include Phase1 mapped to 0/180 phase, and the second mask may include Phase2 and trim mapped to 0/180 phase. Another embodiment of the present invention consists of a set of masks consistent with the foregoing.

BRIEF DESCRIPTION OF THE DRAWINGS

The organization and manner of the structure and operation of the invention, together with further objects and advantages thereof, may best be understood by reference to the following description, taken in connection with the accompanying drawing, wherein:

FIGS. 4 and 5 show masks which are in accordance with an embodiment of the present invention; specifically, FIG. 4 is an enlarged top, plan view of a mask which includes Phase1 mapped to 0/180 phase, and FIG. 5 is an enlarged top, plan view of a mask which includes Phase2 and trim mapped to 0/180 phase;

DESCRIPTION

Figure 1:
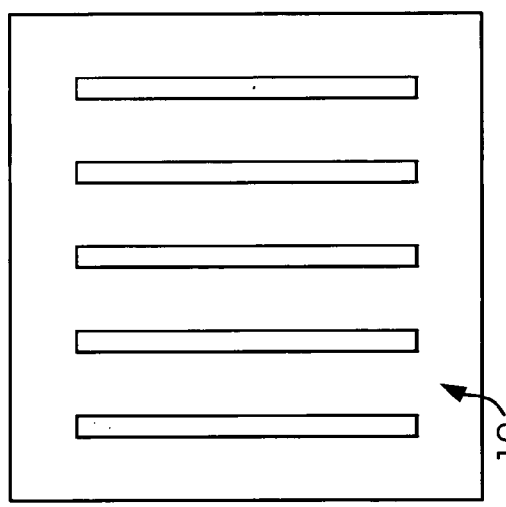
FIG. 1 is an enlarged top, plan view of a target layout.

While the invention may be susceptible to embodiment in different forms, there is shown in the drawings, and herein will be described in detail, a specific embodiment with the understanding that the present disclosure is to be considered an exemplification of the principles of the invention, and is not intended to limit the invention to that as illustrated and described herein.

An embodiment of the present invention provides that phase features are split up and provided on a plurality of masks. Specifically, to provide a target layout 10 such as is shown in FIG. 1, preferably Phase1 14 is mapped to 0/180 phase on a first mask 22 as shown in FIG. 4, and Phase2 16 and trim 20 are mapped to 0/180 phase on a second mask 24 as shown in FIG. 5. This preferably provides that the minimum resolution is enhanced by a factor of n, where n is the number of Alternating-PSM mask decompositions. In the example shown in FIGS. 4 and 5, n=2, and the minimum resolution is doubled. In practice, the minimum resolution is limited by phase window size and exposure tool alignment performance. Binary trim/field mask resolution is enhanced by combining it with a phase mask. Instead of imaging isolated near-resolution-limit contacts and trenches on the binary trim masks (which is very difficult to do reliably), the contacts and trenches are merged with a phase layer, making the combined features much larger and much easier to image. This improves the throughput of double exposure Alternating-PSMs. The same exposure conditions can be used for all exposures instead of using one exposure condition for the phase mask (see FIG. 2) and another exposure condition for the binary mask (see FIG. 3). Converting Phase1 and Phase2+trim into Alternating-PSM is very easy to automate since Phase1 and Phase2+trim are isolated (i.e., form phase islands on chrome).

Figure 6:
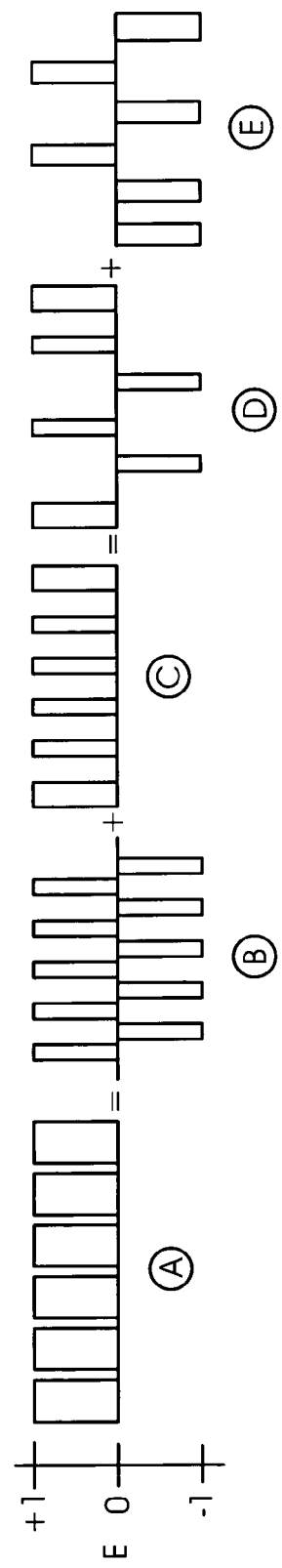
FIG. 6 is a schematic diagram which shows the target layout and effectively compares the masks shown in FIGS. 2 and 3 to the masks shown in FIGS. 4 and 5.
Figure 3:
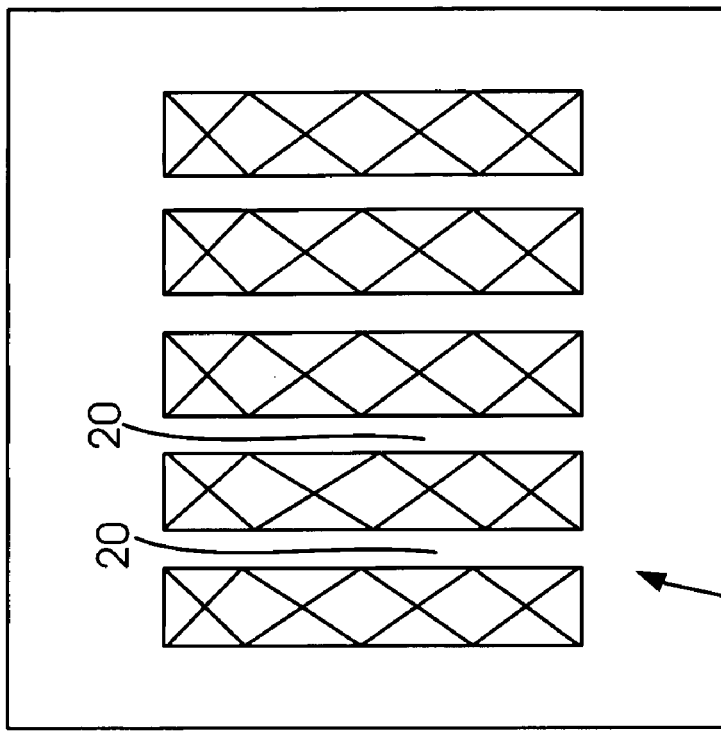
FIG. 3 is an enlarged top, plan view of a binary trim/field mask.
Figure 2:
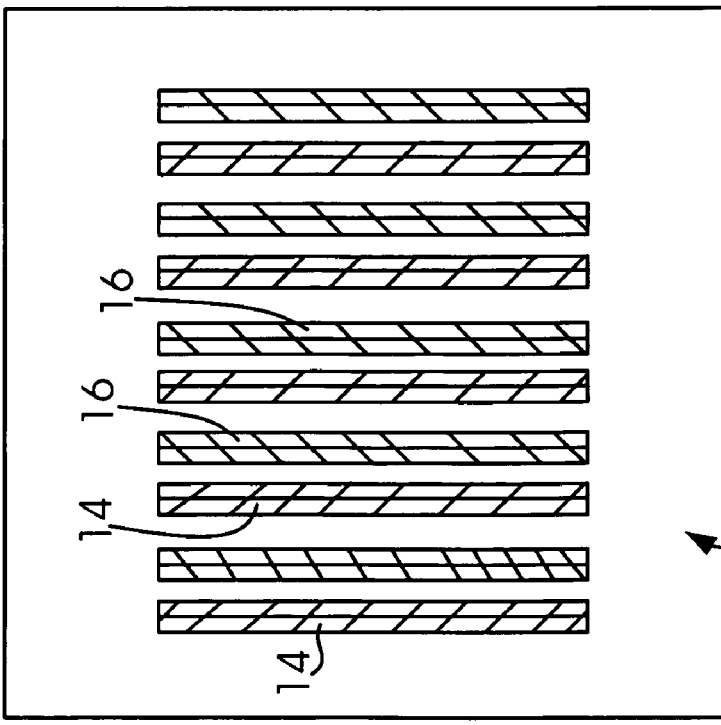
FIG. 2 is an enlarged top, plan view of a phase mask.

FIG. 6 shows the target layout and effectively compares the masks shown in FIGS. 2 and 3 to the masks shown in FIGS. 4 and 5. Specifically, image "A" corresponds to the target layout 10 shown in FIG. 1, image "B" corresponds to the mask 12 shown in FIG. 2, image "C" corresponds to the mask 18 shown in FIG. 3, image "D" corresponds to the mask 22 shown in FIG. 4, and image "E" corresponds to the mask 24 shown in FIG. 5.

Figure 7:
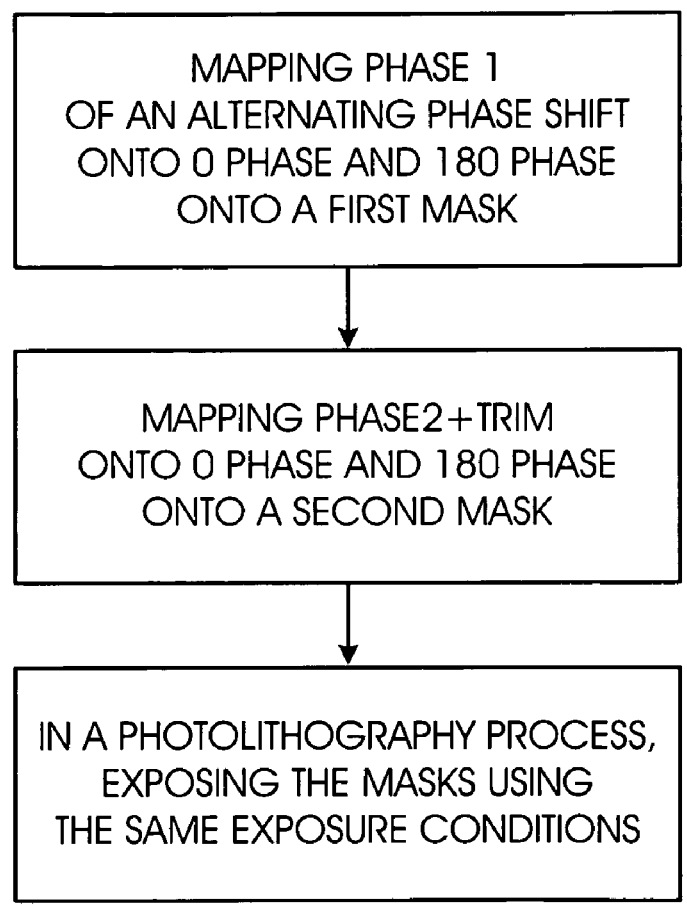
FIG. 7 is a block diagram illustrating a method of making a set of masks, such as the masks shown in FIGS. 4 and 5, where the method is in accordance with an embodiment of the present invention.

FIG. 7 illustrates a method which is in accordance with an embodiment of the present invention. The method includes steps of mapping Phase1 of an alternating phase shift onto 0 phase and 180 phase onto a first mask, mapping Phase2+trim onto 0 phase and 180 phase onto a second mask. Thereafter, in a photolithography process, the masks can be exposed using the same exposure conditions.

Figure 8:
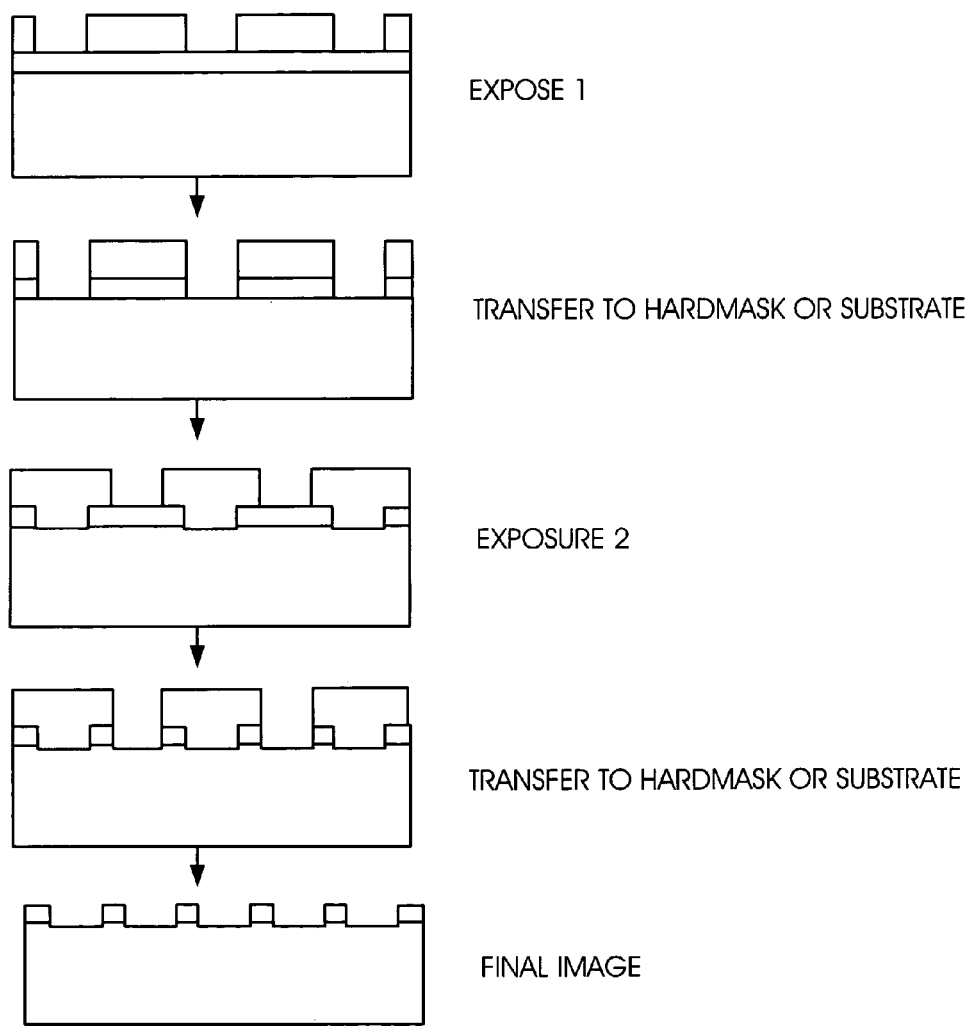
FIG. 8 illustrates the process flow in accordance with an embodiment of the present invention.

FIG. 8 illustrates the process flow which illustrates how the mask would be used in production, since the typical double exposure technique will not generally work.

While an embodiment of the present invention is shown and described, it is envisioned that those skilled in the art may devise various modifications of the present invention without departing from the spirit and scope of the appended claims.

What is claimed is:

1. A method of forming a set of masks, said method comprising: mapping Phase 1 of an alternating phase shift onto a first mask; mapping Phase 2 of an alternating phase shift onto a second mask; and mapping a trim onto at least one of said first mask and said second mask.

2. A method as recited in claim 1, further comprising mapping Phase 1 onto 0 phase and 180 phase.

3. A method as recited in claim 1, further comprising mapping the trim onto the second mask.

4. A method as recited in claim 3, further comprising mapping Phase 2 and trim onto 0 phase and 180 phase.

5. A method as recited in claim 1, wherein said step of mapping Phase 1 of the alternating phase shift onto the first mask comprises mapping Phase 1 of the alternating phase shift onto 0 phase and 180 phase onto the first mask, and wherein said step of mapping Phase 2 of the alternating phase shift onto the second mask comprises mapping Phase2 of the alternating phase shift and mapping a trim onto 0 phase and 180 phase onto the second mask.

6. A method as recited in claim 1, further comprising exposing said first and second masks using the same exposure conditions.

7. A set of masks comprising: a first mask having Phase 1 of an alternating phase shift mapped thereon; a second mask having Phase 2 of an alternating phase shift mapped thereon, at least one of said first and second masks having a trim mapped thereon.

8. A set of masks as recited in claim 7, wherein Phase 1 is mapped as 0 phase and 180 phase.

9. A set of masks as recited in claim 7, wherein the trim is mapped onto the second mask.

10. A set of masks as recited in claim 9, wherein the Phase 2 and trim is mapped onto 0 phase and 180 phase onto the second mask.

* * * * *